(12) United States Patent
Eaves et al.

(10) Patent No.: US 8,598,465 B2
(45) Date of Patent: Dec. 3, 2013

(54) HERMETIC CIRCUIT RING FOR BCB WSA CIRCUITS

(75) Inventors: David M. Eaves, Redondo Beach, CA (US); Xiang Zeng, Monterey Park, CA (US); Kelly J. Hennig, Torrance, CA (US); Patty Pei-Ling Chang-Chien, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 399 days.

(21) Appl. No.: 13/015,132

(22) Filed: Jan. 27, 2011

(65) Prior Publication Data

US 2012/0193133 A1 Aug. 2, 2012

(51) Int. Cl.
*H05K 1/11* (2006.01)

(52) U.S. Cl.
USPC ........... 174/262; 361/760; 361/783; 257/528; 257/620; 257/700; 257/703; 257/758; 438/622; 438/653; 438/703; 438/711; 438/780

(58) Field of Classification Search
USPC ........... 174/262; 361/760, 783; 257/528, 620, 257/700, 703, 758; 438/622, 653, 703, 711, 438/780
See application file for complete search history.

(56) References Cited

U.S. PATENT DOCUMENTS

| | | | | |
|---|---|---|---|---|
| 6,030,901 A * | 2/2000 | Hopper et al. | ............. | 438/711 |
| 6,103,552 A | 8/2000 | Lin | | |
| 6,146,992 A * | 11/2000 | Lauterbach et al. | ........... | 438/623 |
| 6,153,521 A * | 11/2000 | Cheung et al. | ............. | 438/687 |
| 6,211,071 B1 * | 4/2001 | Lukanc et al. | ............. | 438/640 |
| 6,246,118 B1 * | 6/2001 | Buynoski | ............. | 257/758 |
| 6,249,039 B1 * | 6/2001 | Harvey et al. | ............. | 257/531 |
| 6,313,517 B1 * | 11/2001 | Lauterbach et al. | ........... | 257/621 |
| 6,417,090 B1 * | 7/2002 | Wang et al. | ............. | 438/622 |
| 6,486,563 B1 | 11/2002 | Lin | | |
| 6,492,722 B1 * | 12/2002 | Cheung et al. | ............. | 257/700 |
| 6,942,750 B2 | 9/2005 | Chou et al. | | |
| 7,268,200 B2 * | 9/2007 | Townsend et al. | ............. | 528/32 |
| 7,605,470 B2 * | 10/2009 | Ning | ............. | 257/758 |
| 7,960,269 B2 * | 6/2011 | Lo et al. | ............. | 438/598 |
| 2002/0052125 A1 * | 5/2002 | Shaffer, II et al. | ............. | 438/780 |
| 2003/0134453 A1 * | 7/2003 | Prabhu et al. | ............. | 438/113 |
| 2004/0188817 A1 | 9/2004 | Hua et al. | | |

(Continued)

OTHER PUBLICATIONS

J. Oberhammer, F. Niklaus, G. Stemme, Selective Wafer Level Adhesive Bonding with Benzocyclobutene, (2003).

Z.H. Liang, Y.T. Cheng, W. Hsu, Y.W. Lee, A Wafer-Level Hermetic Encapsulation for MEMS Manufacture Application, IEEE Transactions on Advanced Packaging, Aug. 2006, vol. 29, No. 3, pp. 513-519.

R. Pelzer, V. Dragoi, D. Swinnen, P. Soussan, T. Matthias, Wafer-scale BCB Resist-Processing Technologies for High Density Integration and Electronic Packaging, 2005 International Symposium on Electronics Materials and Packaging, Dec. 2005, pp. 187-191.

(Continued)

*Primary Examiner* — Xiaoliang Chen
(74) *Attorney, Agent, or Firm* — John A. Miller; Miller IP Group, PLC

(57) ABSTRACT

A wafer-scale assembly circuit including a plurality of metal interconnect layers, where each metal layer includes patterned metal portions and where at least some of the patterned metal portions are RF signal lines. The circuit further includes at least one benzocyclobutene layer provided between two metal interconnect layers that includes at least one trench via formed around a perimeter of the benzocyclobutene layer at a circuit sealing ring, where the trench via provides a hermetic seal at the sealing ring. The benzocyclobutene layer also includes a plurality of stabilizing post vias formed through the benzocyclobutene layer adjacent to the trench via proximate to the sealing ring and extending around the perimeter of the benzocyclobutene layer, where the stabilizing vias operate to prevent the benzocyclobutene layer from shrinking in size.

20 Claims, 3 Drawing Sheets

(56) References Cited

U.S. PATENT DOCUMENTS

| | | | |
|---|---|---|---|
| 2004/0259292 A1* | 12/2004 | Beyne et al. | 438/125 |
| 2005/0069782 A1* | 3/2005 | Elenius et al. | 430/5 |
| 2006/0057836 A1* | 3/2006 | Nagarajan et al. | 438/622 |
| 2006/0063393 A1* | 3/2006 | Shaffer et al. | 438/780 |
| 2007/0120223 A1 | 5/2007 | McKinzie, III et al. | |
| 2007/0145523 A1* | 6/2007 | Chow et al. | 257/528 |
| 2007/0148895 A1* | 6/2007 | Van Schuylenbergh et al. | 438/381 |
| 2007/0278631 A1 | 12/2007 | Sharifi et al. | |
| 2007/0290248 A1 | 12/2007 | Weis | |
| 2009/0029554 A1* | 1/2009 | Chang-Chien et al. | 438/703 |
| 2010/0078769 A1* | 4/2010 | West et al. | 257/620 |
| 2010/0246152 A1* | 9/2010 | Lin et al. | 361/783 |
| 2011/0026232 A1* | 2/2011 | Lin et al. | 361/760 |
| 2011/0117271 A1* | 5/2011 | Barriere et al. | 427/126.2 |
| 2011/0263119 A1* | 10/2011 | Li et al. | 438/653 |

OTHER PUBLICATIONS

H.A.C. Tilmans, H. Ziad, H. Jansen, O. Di Monaco, A. Jourdain, W. De Raedt, X. Rottenberg, E. De Backer, A. Decaussemaeker, K. Baert, Wafer-level packaged RF-MEMS switches fabricated in a CMOS fab, Electron Devices Meeting, IEDM Technical Digest, Dec. 2001, pp. 41.4.1-41.4.4.

A. Jourdain, H. Ziad, P. De Moor, H.A.C. Tilmans, Wafer-Scale 0-Level Packaging of (RF-)MEMS Devices Using BCB, Symposium on Design, Test, Integration and Packaging of MEMS/MOEMS 2003, May 2003, pp. 239-244.

D. Forehand, C. Goldsmith, Wafer Level Micropackaging for RF MEMS Switches, Proceedings of IPACK2005, ASME inter PACK '05, Jul. 2005.

P.J.Y. Lee, Wafer Level Hermetic Cavity Packaging for MEMS Devices, MCEN5166 Electronic Packaging and Manufacturing, Progress Report, (2005).

* cited by examiner

US 8,598,465 B2

HERMETIC CIRCUIT RING FOR BCB WSA CIRCUITS

BACKGROUND

1. Field of the Disclosure

This invention relates generally to wafer-scale assembly (WSA) circuits that include benzocyclobutene (BCB) layers and, more particular, to WSA circuits that include BCB layers, and trench vias and a checkerboard pattern of vias through the BCB layers at a sealing ring edge of the layer to provide a hermetic seal and prevent BCB layer shrinkage.

2. Discussion of the Related Art

It is known in the art to provide wafer-level packages for integrated circuits, such as monolithic millimeter-wave integrated circuits (MMIC), formed on substrate wafers. In one wafer-level packaging design, a cover wafer is formed to the substrate wafer by a sealing ring so as to provide a hermetically sealed cavity in which the integrated circuit is provided. During wafer-scale assembly (WSA), many integrated circuits are formed on the substrate wafer and covered by a single cover wafer, where each integrated circuit is surrounded by a separate sealing ring. The cover wafer and the substrate are then diced between the sealing rings to separate the packages for each separate integrated circuit. The dicing process typically uses a saw that cuts the cover wafer between the packages where a portion of the cover wafer is removed. The substrate wafer is then cut between the packages. For certain wafer-level packaging designs, vias are provided through the substrate wafer that make electrical contact with signal lines and ground lines electrically coupled to the integrated circuit within the cavity.

As is well understood by those skilled in the art, integrated circuit design and WSA packaging allow for many circuit components to be fabricated in a small area. Some of these designs employ stacked metal interconnect layers where several interconnect layers are fabricated on top of each other. It has been proposed in the art to use a BCB layer to separate interconnect layers to increase device performance. The BCB layer is an insulated layer that prevents DC current from traveling from one interconnect layer to another interconnect layer, but allows RF signals to propagate therethrough, which may benefit certain circuit designs where signal line cross talk is desirable. As the number of interconnect layers increases, the complexity of the circuit can increase so that more powerful devices can be provided in a smaller hermetically sealed environment. Particularly, high frequency RF lines can cross over each other if there is a BCB layer between them that prevents a DC short between the lines. By depositing a BCB layer on an interconnect layer on either the substrate wafer or the cover wafer, another interconnect layer can be formed on the BCB layer and be electrically isolated therefrom. Metal vias would be fabricated through the BCB layers to allow interconnections between the various interconnect layers.

The increase in the number of interconnect layers in a WSA circuit enables new types of WSA circuit designs to be implemented, which would otherwise not be possible with standard MMIC or WSA MMIC devices. The insertion of RF shielding between interconnect layers in the vertical direction helps enable these new circuit designs to be realized. Unshielded RF coupling in the vertical direction also enables such designs. The RF shield is a metal layer that prevents both RF and DC signals from traveling from one interconnect layer to another.

The various interconnect layers extend to a sealing ring at an outer edge of the WSA package. However, BCB is not a hermetic material and includes a large amount of tensile stress. In order to provide the hermetic seal at the edge of the sealing ring where the BCB layers are located, an etch would need to be provided that was then filled with a metal via between the interconnect layers on opposite sides of the BCB layer so that hermetic seal of the ring can be established. However, when such a BCB via is formed at the sealing location of the ring, the tensile strength of the BCB material causes it to pull away from the metal, which affects device integrity. More particularly, the etch for the sealing vias in the BCB layers causes the BCB layer to shrink, which may disturb connect vias through the BCB layer at other locations in the assembly.

DETAILED DESCRIPTION OF THE EMBODIMENTS

The following discussion of the embodiments of the invention directed to a wafer-scale assembly including a plurality of interconnect layers and BCB layers is merely exemplary in nature, and is in no way intended to limit the invention or its applications or uses.

Figure 1:
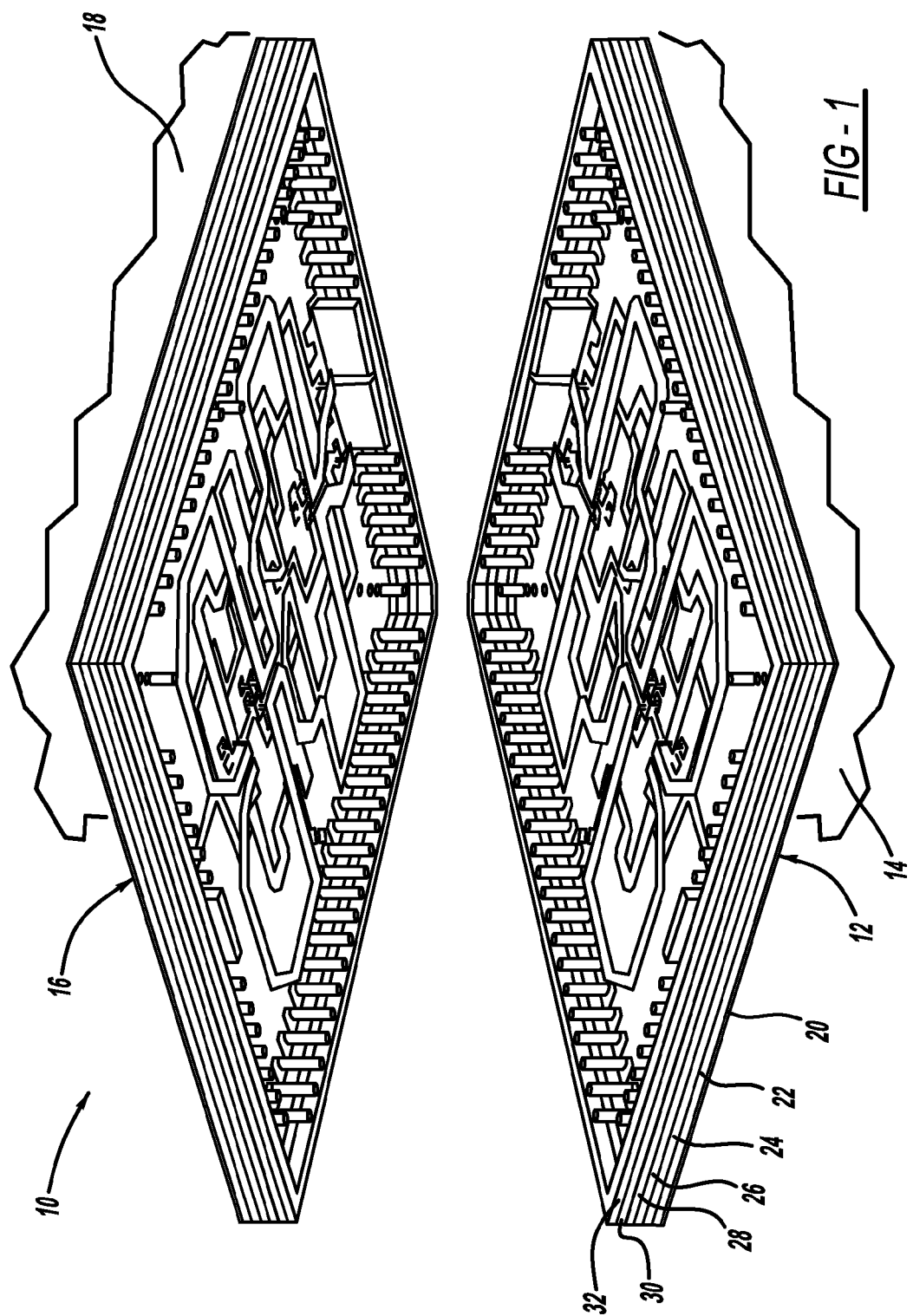
FIG. 1 is an exploded perspective view of a wafer-scale assembly circuit including a wafer portion having a plurality of interconnect layers and a cover portion having a plurality of interconnect layers.

FIG. 1 is an exploded perspective view of a WSA circuit 10 including a wafer portion 12 fabricated on a substrate wafer 14 and a cover portion 16 fabricated on a cover wafer 18. As is well understood by those skilled in the art, during wafer level fabrication, the various layers are formed on the substrate wafer 14 and the various layers are fabricated on the cover wafer 18 where many circuits to be hermetically sealed within a package are simultaneously fabricated on the wafers 14 and 18. The wafers 14 and 18 with the several circuits are positioned relative to each other and a sealing step is performed where sealing layers of a sealing ring are sealed together so that the circuit 10 is provided within a sealed cavity between the substrate wafer 14 and the cover wafer 18. A dicing process is then performed to separate the individual packages so that each separate circuit is separated from the overall substrate wafer 14 and the cover wafer 18 as individual packages. Only one of the packages is shown in FIG. 1.

The wafer portion 12 includes a plurality of metal interconnect layers fabricated on the substrate wafer 14, as will be discussed in detail below. These layers include a first metal interconnect layer 20 deposited on the substrate wafer 14, a second metal interconnect layer 22 deposited on the first metal layer 20, a first BCB layer 24 deposited on the second metal layer 22, a third metal interconnect layer 26 deposited on the first BCB layer 24, a second BCB layer 28 deposited on the third metal layer 26, a fourth metal interconnect layer 30 deposited on the second BCB layer 28, and an inter-cavity interconnect (ICIC) layer 32 deposited on the fourth metal layer 30. The BCB layers 24 and 28 are not shown within the sealing ring area so that other layers and elements can be seen. The cover wafer portion 16 includes the same layers deposited in the same manner in the same order. This illustration only shows signal traces and other metalized areas, such as shields, that may be necessary for a particular circuit to provide the various interconnects. The actual device components, such as MMIC devices, are not shown and would likely be on the layer directly on the wafer 14 or 18 either adjacent to or within the first metal layer 20.

Figure 2:
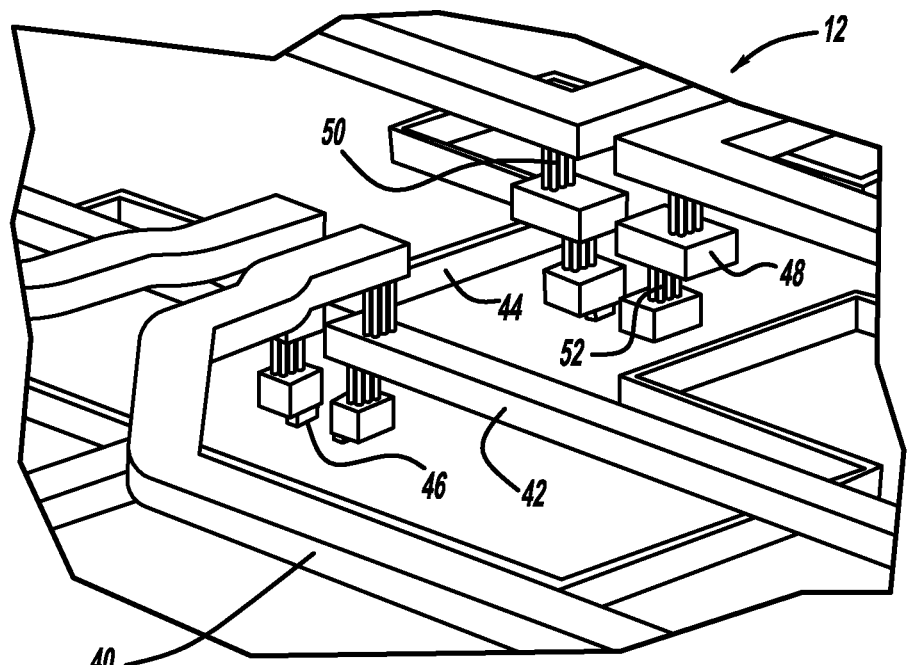
FIG. 2 is a broken-away perspective view of a portion of the wafer portion of the wafer-scale assembly shown in FIG. 1.

FIG. 2 is a blown-up part of the wafer portion 12, and shows that the fourth metal layer 30 includes a plurality of RF signal lines 40, the third metal layer 26 includes a plurality of RF signal lines 42, the second metal layer 22 includes a plurality of RF signal lines 44 and the first metal layer 20 includes metal contacts 46. The BCB layers 24 and 28 have been removed from this view for clarity purposes. The various RF lines are electrically coupled through the BCB layers 24 and 28 by metal vias. Particularly, vias 50 are shown formed through the second BCB layer 28 and vias 52 are shown through the first BCB layer 24. The second metal layer 22 also includes RF metal shields 48. When the cover wafer portion 16 is formed to the substrate wafer portion 12, the ICIC layers 32 are heated so that they seal together so that a cavity within the WSA circuit is hermetically sealed. The combination of the various metal layers, BCB layers and ICIC layers form a sealing ring at their outer edges.

Figure 3:
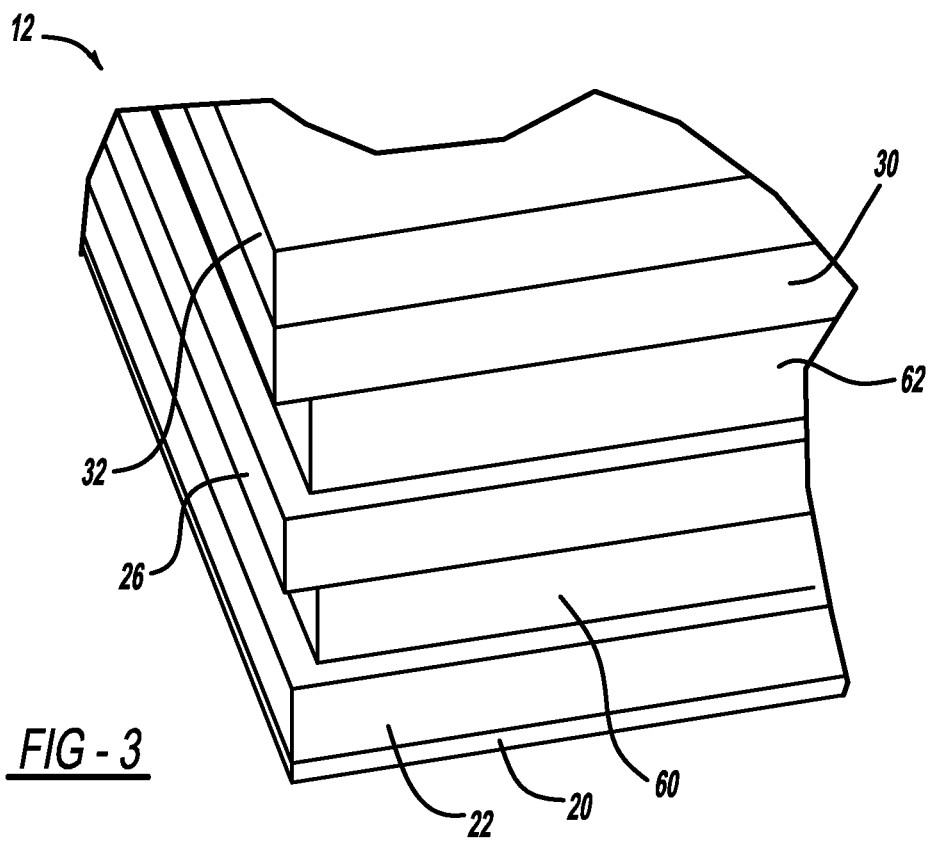
FIG. 3 is a cut-away, perspective, outside view of the wafer portion of the wafer-scale assembly shown in FIG. 1.

As discussed above, the BCB layers 24 and 28 are not hermetic, and therefore a sealing area needs to be provided at an outer edge of the BCB layers 24 and 28 to maintain the hermetic seal. FIG. 3 is a cut-away, perspective, outside view of the substrate wafer portion 12 showing the various layers discussed above. In this view, the BCB layers 24 and 28 are again not specifically shown so that vias discussed in detail below can be seen. FIG. 3 shows an outside trench via 60 that extends through the BCB layer 24 and is operable to provide a sealing wall that helps provide a hermitic seal at the sealing ring. Likewise, FIG. 3 shows an outside trench via 62 through the BCB layer 28 that also helps provide the hermetic ring seal at the sealing ring. As will be understood by those skilled in the art, the trench vias 60 and 62 are formed through the BCB layers 24 and 28 where the BCB layers 24 and 28 are etched to define a trench in which the metal that forms the trench vias 60 and 62 is deposited. Therefore, a portion of the BCB layers 24 and 28 would be outside of the trench vias 60 and 62, respectively, where if those layers 24 and 28 were not removed from the view shown in FIG. 3, the trench vias 60 and 62 would not be seen.

An inside trench via 64 (see FIG. 5) is provided adjacent to and spaced from the outside trench via 60 where a portion of the BCB layer 24 would be provided therebetween. Likewise, an inside trench via (not shown) is provided adjacent to and spaced from the outside trench via 62, where a portion of the BCB layer 28 would be provided between these vias. In this embodiment, there are two trench vias formed through each of the BCB layers 24 and 28 that provide the hermitic seal at these layers. This is by way of a non-limiting example in that any suitable number of trench vias can be included to provide the desired hermetic seal, which may depend on the particular material being used in the trench vias, the width of the trench vias, etc.

Figure 4:
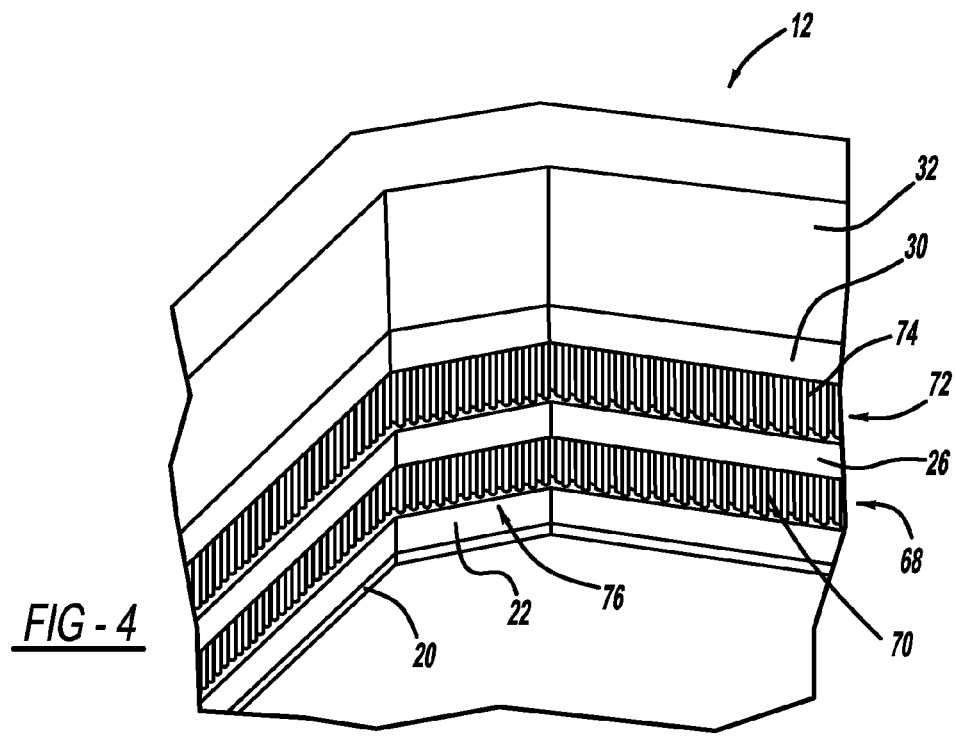
FIG. 4 is a cut-away, perspective, inside view of the wafer portion of the wafer-scale assembly shown in FIG. 1.

FIG. 4 is a cut-away, perspective, inside view of the substrate wafer portion 12. As discussed above, the BCB material tends to shrink as a result of its relatively high tensile strength when the trench vias are formed, which may cause circuit misalignment at other locations in the circuit 10. In order to overcome this problem, the present invention proposes providing a checkerboard pattern of vias 68 adjacent to the inside via 64 where the checkerboard pattern of vias 68 includes a plurality of post vias 70 formed in rows, as shown. The post vias 70 are formed in a periodic pattern through the BCB layer 24 so that they act as anchoring points at the sealing ring of the WSA circuit 10 to prevent the BCB layer 24 from shrinking when the trench vias 60 and 64 are formed. The post vias 70 can have any suitable diameter and be spaced apart in any suitable spacing pattern to provide this desired result. Likewise, a checkerboard pattern of vias 72 is provided in the BCB layer 28 that includes post vias 74 for this purpose.

Figure 5:
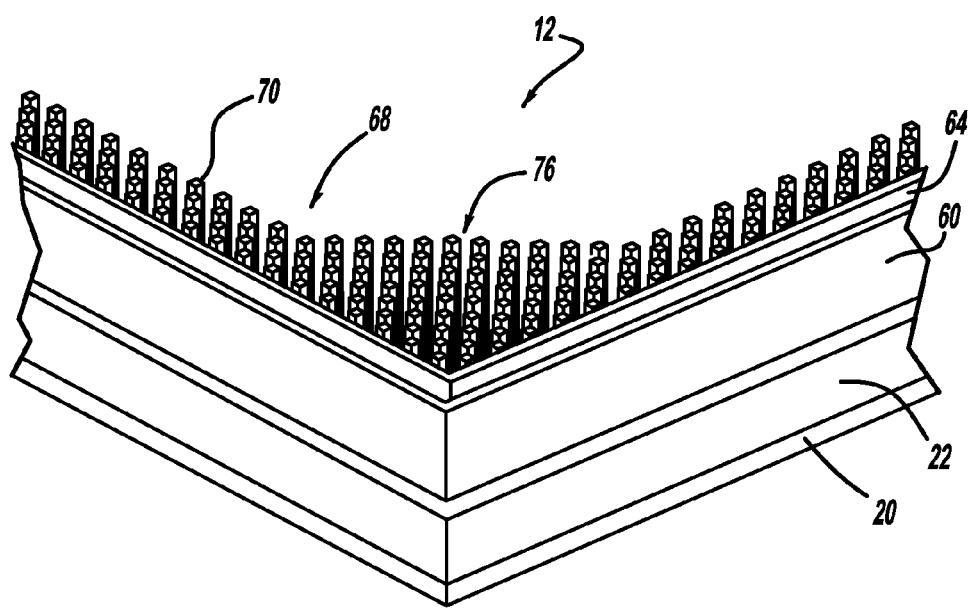
FIG. 5 is a cut-away, perspective, outside view of the wafer portion of the wafer-scale assembly shown in FIG. 1.

FIG. 5 illustrates a portion of the substrate wafer portion 12 during the fabrication of the WSA circuit 10. The first metal layer 20 and the second metal layer 22 have been deposited and patterned, and the BCB layer 24, although not specifically shown again for clarity purposes, has been patterned and etched to provide the openings where the trench vias 60 and 64 will be deposited and the post vias 70 for the checker-board pattern of vias 68 will be deposited along the sealing ring. The metal that forms the trench vias 60 and 64 is actually deposited within the openings etched in the BCB layer 24 during the metal deposition process for the third metal layer 26. The trench vias and the checkerboard pattern of vias 72 formed in the BCB layer 28 are formed in the same manner where the deposition of the fourth metal layer 30 provides the metal that actually forms the trench vias and the checkerboard pattern of vias 72 in the BCB layer 28.

In this non-limiting embodiment, corner areas 76 of the sealing ring include an extended seal area where more of the post vias 70 are provided. Particularly, along the edge of the sealing ring, four rows of the post vias 70 are provided, whereas up to eight rows of the post vias 70 are formed in the corner area 76.

The foregoing discussion discloses and describes merely exemplary embodiments. One skilled in the art will readily recognize from such discussion, and from the accompanying drawings and claims, that various changes, modifications and variations can be made therein without departing from the spirit and scope of the disclosure as defined in the following claims.

What is claimed is:

1. A wafer-scale assembly circuit comprising:
   a plurality of metal interconnect layers, each metal layer including patterned metal portions where at least some of the patterned metal portions are RF signal lines;
   at least one benzocyclobutene layer provided between two metal interconnect layers;
   at least one trench via formed around a perimeter of the at least one benzocyclobutene layer at a circuit sealing ring, said trench via providing a hermetic seal at the sealing ring for the at least one benzocyclobutene layer; and
   a plurality of stabilizing post vias formed through the at least one benzocyclobutene layer adjacent to the at least one trench via proximate to the sealing ring and extending around the perimeter of the at least one benzocyclobutene layer, said plurality of stabilizing vias operating to prevent the benzocyclobutene layer from shrinking in size.

2. The circuit according to claim 1 wherein the plurality of stabilizing post vias form a checkerboard pattern.

3. The circuit according to claim 1 wherein the at least one trench via is two trench vias formed parallel to each other through the benzocyclobutene layer and being spaced apart from each other.

4. The circuit according to claim 1 further comprising an inter-cavity interconnect layer formed on the plurality of metal interconnect layers, said inter-cavity interconnect layer being operable to be sealed to another inter-cavity interconnect layer to form a hermetically sealed cavity.

5. The circuit according to claim 1 wherein the plurality of metal interconnect layers is four metal interconnect layers and the at least one benzocyclobutene layer is two benzocyclobutene layers where a first benzocyclobutene layer is formed between first and second metal layers and a second benzocyclobutene layer is formed between the second metal layer and a third metal layer.

6. The circuit according to claim 1 wherein a portion of at least one of the plurality of interconnect metal layers provides an RF shield between RF signal lines on opposite sides of the RF shield in other metal layers.

7. The circuit according to claim 1 wherein the plurality of stabilizing vias define rows of stabilizing vias around the perimeter of the at least one benzocyclobutene layer, and wherein corners of the sealing ring include more rows of the stabilizing vias than edges of the sealing ring.

8. The circuit according to claim 1 wherein the at least one trench via and the plurality of stabilizing vias are metal vias.

9. The circuit according to claim 1 wherein the plurality of metal interconnect layers and the at least one benzocyclobutene layer are fabricated on a substrate wafer.

10. The circuit according to claim 1 wherein the plurality of metal interconnect layers and the at least one benzocyclobutene layer are formed on a cover wafer.

11. A wafer-scale assembly circuit comprising:
a plurality of metal interconnect layers, each metal layer including patterned metal portions where at least some of the patterned metal portions are RF signal lines;
at least two benzocyclobutene layers each being provided between two metal interconnect layers;
at least two metal trench vias formed around a perimeter of each of the benzocyclobutene layers at a circuit sealing ring, said trench vias being spaced apart from each other and providing a hermetic seal at the sealing ring for the particular benzocyclobutene layer; and
a plurality of metal stabilizing post vias formed through each benzocyclobutene layer adjacent to the trench vias proximate to the sealing ring and extending around the perimeter of the at least one benzocyclobutene layer, said plurality of stabilizing vias being formed in a checkerboard pattern and operating to prevent the benzocyclobutene layer from shrinking in size.

12. The circuit according to claim 11 wherein a portion of at least one of the plurality of interconnect metal layers provides an RF shield between RF signal lines on opposite sides of the RF shield in other metal layers.

13. The circuit according to claim 11 wherein corners of the sealing ring include more rows of the stabilizing vias than edges of the sealing ring.

14. The circuit according to claim 11 further comprising an inter-cavity interconnect layer formed on the plurality of metal interconnect layers, said inter-cavity interconnect layer being operable to be sealed to another inter-cavity interconnect layer to form a hermetically sealed cavity.

15. The circuit according to claim 11 wherein the plurality of metal interconnect layers and the at least two benzocyclobutene layers are fabricated on a substrate wafer.

16. The circuit according to claim 11 wherein the plurality of metal interconnect layers and the at least two benzocyclobutene layers are formed on a cover wafer.

17. A wafer-scale assembly circuit comprising:
a wafer;
a first metal interconnect layer formed on the wafer;
a second metal interconnect layer formed on the first interconnect layer;
a first benzocyclobutene layer formed on the second metal layer, said first benzocyclobutene layer including two metal trench vias formed around a perimeter of the first benzocyclobutene layer at a circuit sealing ring, said trench vias being spaced apart from each other and providing a hermetic seal at the sealing ring for the first benzocyclobutene layer, said first benzocyclobutene layer further including a plurality of metal stabilizing post vias formed through the first benzocyclobutene layer adjacent to the trench vias proximate to the sealing ring and extending around the perimeter of the first benzocyclobutene layer, said plurality of stabilizing vias being formed in a checkerboard pattern and operating to prevent the first benzocyclobutene layer from shrinking in size;
a third metal interconnect layer formed on the first benzocyclobutene layer;
a second benzocyclobutene layer formed on the third metal layer, said second benzocyclobutene layer including two metal trench vias formed around a perimeter of the second benzocyclobutene layer at the circuit sealing ring, said trench vias being spaced apart from each other and providing a hermetic seal at the sealing ring for the second benzocyclobutene layer, said second benzocyclobutene layer further including a plurality of metal stabilizing post vias formed through the second benzocyclobutene layer adjacent to the trench vias proximate to the sealing ring and extending around the perimeter of the second benzocyclobutene layer, said plurality of stabilizing vias being formed in a checkerboard pattern and operating to prevent the second benzocyclobutene layer from shrinking in size; and
a fourth metal interconnect layer formed on the second benzocyclobutene layer.

18. The circuit according to claim 17 wherein corners of the sealing ring include more rows of the stabilizing vias than edges of the sealing ring.

19. The circuit according to claim 17 further comprising an inter-cavity interconnect layer formed on the fourth metal layer, said inter-cavity interconnect layer being operable to be sealed to another inter-cavity interconnect layer to form a hermetically sealed cavity.

20. The circuit according to claim 17 wherein the wafer is a substrate wafer or a cover wafer.

\* \* \* \* \*